(12) United States Patent
Oda

(10) Patent No.: US 11,223,056 B2
(45) Date of Patent: Jan. 11, 2022

(54) FUEL CELL SYSTEM

(71) Applicant: Toyota Jidosha Kabushiki Kaisha, Toyota (JP)

(72) Inventor: Kohei Oda, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 197 days.

(21) Appl. No.: 16/280,404

(22) Filed: Feb. 20, 2019

(65) Prior Publication Data

US 2019/0260046 A1    Aug. 22, 2019

(30) Foreign Application Priority Data

Feb. 22, 2018  (JP) .............................. JP2018-029773

(51) Int. Cl.
*H01M 8/04298* (2016.01)
*G01R 31/382* (2019.01)
(Continued)

(52) U.S. Cl.
CPC ...... *H01M 8/04298* (2013.01); *G01R 31/382* (2019.01); *H01M 10/44* (2013.01);
(Continued)

(58) Field of Classification Search
CPC ......... H01M 8/04298; H01M 8/04731; H01M 8/04626; H01M 16/006; H01M 10/613; H01M 10/625; H01M 10/63; H01M 10/44; H01M 10/46; H01M 10/48; G01R 31/382; Y02E 60/10; Y02E 60/50; Y02T 10/7072; Y02T 10/70; Y02T 10/72
See application file for complete search history.

(56) References Cited

U.S. PATENT DOCUMENTS

| 8,907,616 B2* | 12/2014 | Liu ..................... H01M 16/006 320/101 |
| 2014/0303821 A1* | 10/2014 | Oda ........................ B60L 58/30 701/22 |

(Continued)

FOREIGN PATENT DOCUMENTS

| JP | 2007-053051 A | 3/2007 |
| JP | 2010244980 A | 10/2010 |

(Continued)

*Primary Examiner* — Matthew T Martin
(74) *Attorney, Agent, or Firm* — Dinsmore & Shohl LLP

(57) ABSTRACT

A fuel cell system includes a power supply circuit that supplies electric power from a fuel cell and a secondary battery to the load and charges the secondary battery with electric power from the fuel cell. A decision value acquirer monitors a charge-discharge state of the secondary battery and obtains a decision value that is used to determine a degree of localization of an ion concentration in an electrolytic solution in the secondary battery. When the decision value becomes equal to or greater than a predetermined reference value, a controller limits discharge of the secondary battery. When the decision value is equal to or greater than the reference value and the required power decreases, the controller limits a decrease in output power of the fuel cell and causes the secondary battery to be charged with the electric power corresponding to the limitation imposed on the decrease in output power.

7 Claims, 13 Drawing Sheets

(51) Int. Cl.
  *H01M 16/00* (2006.01)
  *H01M 10/613* (2014.01)
  *H01M 10/625* (2014.01)
  *H01M 10/63* (2014.01)
  *H01M 10/44* (2006.01)

(52) U.S. Cl.
  CPC ....... *H01M 10/613* (2015.04); *H01M 10/625* (2015.04); *H01M 10/63* (2015.04); *H01M 16/006* (2013.01); *H01M 2250/20* (2013.01)

(56) References Cited

U.S. PATENT DOCUMENTS

| | | | |
|---|---|---|---|
| 2016/0114690 A1* | 4/2016 | Matsubara | B60L 11/1861 307/10.1 |
| 2017/0120774 A1 | 5/2017 | Obata | |
| 2017/0331138 A1 | 11/2017 | Kamiya et al. | |

FOREIGN PATENT DOCUMENTS

| | | |
|---|---|---|
| JP | 2012-218599 A | 11/2012 |
| JP | 2013-164917 A | 8/2013 |
| JP | 2014003826 A | 1/2014 |
| JP | 2016143546 A | 8/2016 |
| JP | 2017091602 A | 5/2017 |
| JP | 2017129409 A | 7/2017 |
| JP | 2017204407 A | 11/2017 |

\* cited by examiner

FUEL CELL SYSTEM

CROSS-REFERENCE TO RELATED APPLICATIONS

The present application claims priority from Japanese patent application 2018-29773 filed on Feb. 22, 2018, the entirety of the content of which is hereby incorporated by reference into this application.

BACKGROUND

Field

The present disclosure relates to a fuel cell system.

Related Art

A fuel cell system proposed in JP 2010-244980A causes a fuel cell and second battery to output electric power in order that a power required from a load is supplied to the load.

In this fuel cell system, when the required power from the load is kept at a high level, the secondary battery is likely to fall into an over-discharge state. This over-discharge state produces localization of an ion concentration in an electrolytic solution included in the secondary battery. It is known that continuing such an over-discharge state causes degradation of the battery performance of the secondary battery. In the fuel cell system described above, imposing a limitation on discharge from the secondary battery when the secondary battery falls into the over-discharge state, with a view to suppressing degradation of the battery performance of the secondary battery, is likely to cause a following problem: The output power becomes insufficient for the required power from the load. In order to address this problem, there is a need for a technique for the fuel cell system to reduce the possibility of occurrence of the shortage of the overall output power of the fuel cell system for the required power, while restraining the secondary battery from continuing the over-discharge state.

SUMMARY

According to one aspect of the present disclosure, there is provided a fuel cell system configured to supply a required power that is required from a load. The fuel cell system comprises a power supply circuit that includes a fuel cell and a secondary battery and is configured to supply electric power from the fuel cell and the secondary battery to the load and to charge the secondary battery with electric power from the fuel cell; a decision value acquirer configured to monitor a charge-discharge state of the secondary battery for obtaining a decision value that is used to determine a degree of localization of an ion concentration in an electrolytic solution included in the secondary battery; and a controller configured to control the power supply circuit according to the decision value. When the decision value becomes equal to or greater than a predetermined reference value, the controller imposes a limitation on discharge of the secondary battery. When the decision value is equal to or greater than the reference value and the required power decreases, the controller imposes a limitation on a decrease in output power of the fuel cell to charge secondary battery with at least part of electric power corresponding to the limitation imposed on the decrease in output power.

DETAILED DESCRIPTION

A. First Embodiment

A1. System Configuration

Figure 1:
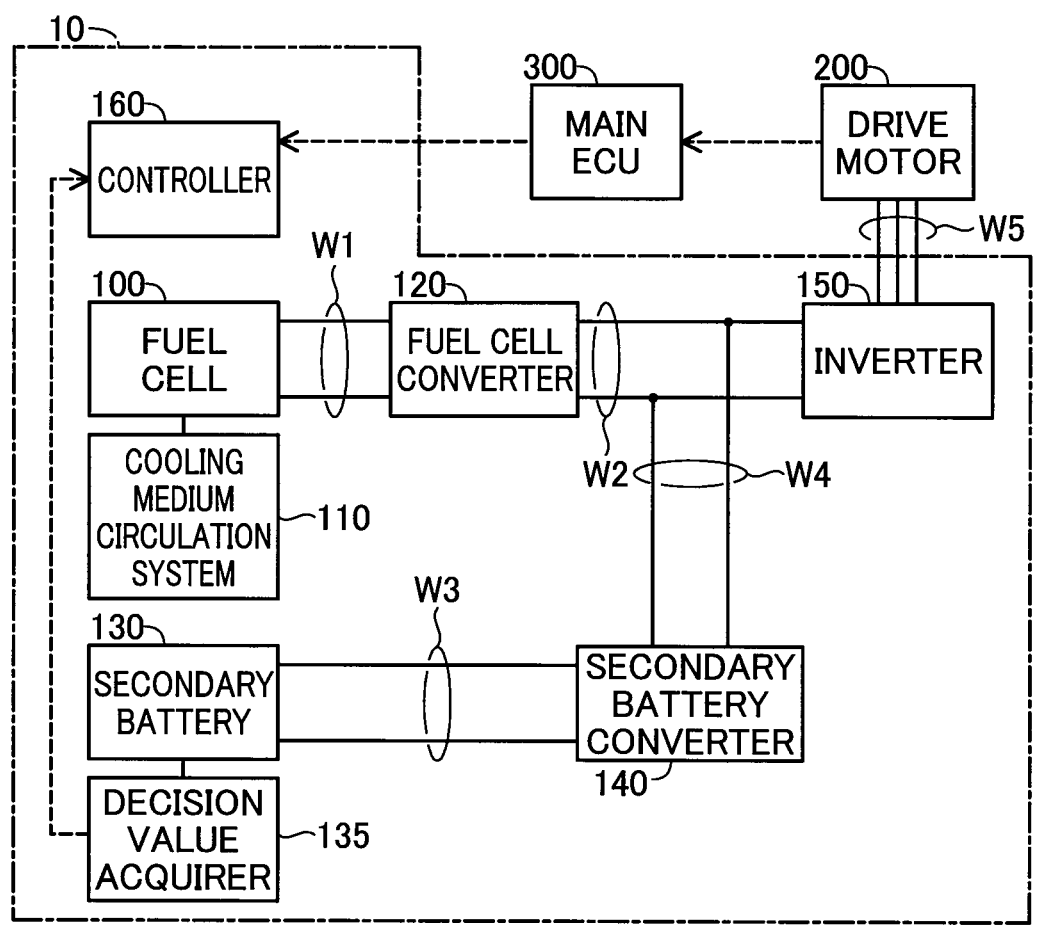
FIG. 1 is a diagram illustrating the configuration of a fuel cell system according to a first embodiment.

FIG. 1 is a diagram illustrating the configuration of a fuel cell system 10 according to a first embodiment. The fuel cell system 10 is used as a power source of a vehicle that is driven by a drive motor 200. The fuel cell system 10 includes a fuel cell 100, a cooling medium circulation system 110, a fuel cell converter 120, a secondary battery 130, a decision value acquirer 135, a secondary battery converter 140, an inverter 150 and a controller 160. The fuel cell system 10 also includes a DC conductor W1, a DC conductor W2, a DC conductor W3, a DC conductor W4 and an AC conductor W5.

The fuel cell 100 is a solid polymer electrolyte fuel cell configured to receive supplies of hydrogen gas and oxygen and generate electric power by an electrochemical reaction of hydrogen with oxygen. The fuel cell 100 is, however, not limited to the solid polymer electrolyte fuel cell, but any of various other types of fuel cells may be employed for the fuel cell 100. For example, a solid oxide fuel cell, in place of the solid polymer electrolyte fuel cell, may be employed for the fuel cell 100. The fuel cell 100 is electrically connected with the fuel cell converter 120 via the DC conductor W1.

Figure 2:
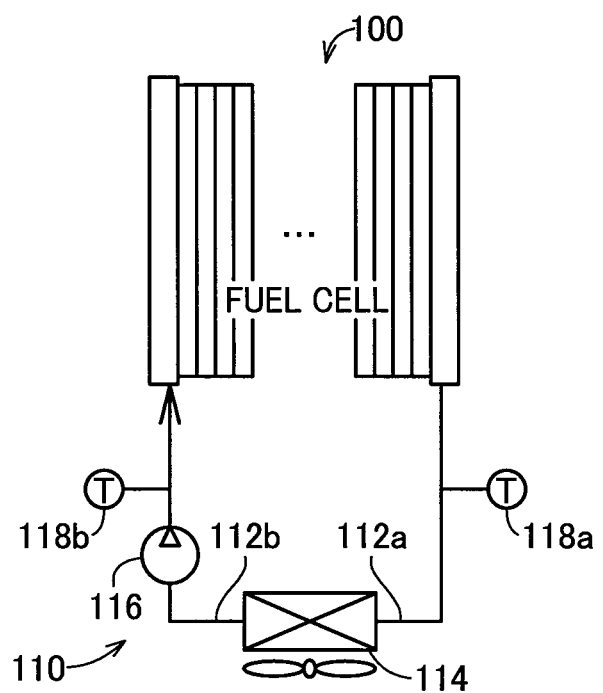
FIG. 2 is a diagram illustrating the configuration of a cooling medium circulation system.

FIG. 2 is a diagram illustrating the configuration of the cooling medium circulation system 110. The cooling medium circulation system 110 is a system configured to circulate a cooling medium that serves to cool down the fuel cell 100. The cooling medium circulation system 110 includes an upstream-side pipe arrangement 112a, a downstream-side pipe arrangement 112b, a radiator 114, a cooling medium circulation pump 116, an upstream-side temperature sensor 118a and a downstream-side temperature sensor 118b.

The upstream-side pipe arrangement 112a and the downstream-side pipe arrangement 112b are cooling medium pipes arranged to cool down the cooling medium that is used to cool down the fuel cell 100. The upstream-side pipe arrangement 112a is provided to connect an inlet of the radiator 114 with an outlet of a cooling medium discharge manifold (not shown) in the fuel cell 100. The downstream-side pipe arrangement 112b is provided to connect an outlet of the radiator 114 with an inlet of a cooling medium supply manifold (not shown) in the fuel cell 100.

The radiator 114 serves to cool down the cooling medium by heat exchange between the cooling medium and the outside air. The cooling medium circulation pump 116 is provided in the middle of the downstream-side pipe arrangement 112b to feed the cooling medium that is cooled down in the radiator 114, to the fuel cell 100. The upstream-side temperature sensor 118a and the downstream-side temperature sensor 118b are respectively provided in the upstream-side pipe arrangement 112a and in the downstream-side pipe arrangement 112b.

Referring back to FIG. 1, the fuel cell converter 120 is a boosting-type converter unit and is configured to perform a stepping up operation to step up the output voltage of the fuel cell 100 to a target voltage. The fuel cell converter 120 is electrically connected with the inverter 150 via the DC conductor W2.

The secondary battery 130 serves, along with the fuel cell 100, as an electric power source of the fuel cell system 10. The secondary battery 130 is configured by a lithium ion battery. The secondary battery 130 may be another type of battery such as a lead acid battery, a nickel cadmium battery or a nickel hydrogen battery. The secondary battery 130 is electrically connected with the secondary battery converter 140 via the DC conductor W3. The secondary battery 130 is rechargeable with electric power supplied from the fuel cell 100.

The decision value acquirer 135 is configured to monitor the charge-discharge state of the secondary battery 130 and obtain a decision value that is used to determine the degree of localization of ion concentration in an electrolytic solution included in the secondary battery 130. More specifically, the decision value denotes a value used to evaluate the degree of over-discharge of the secondary battery 130. The decision value acquirer 135 sends the obtained decision value to the controller 160.

The following describes the over-discharge state. The over-discharge state denotes such a state that the electrolytic solution has a higher ion concentration on a negative electrode side and a lower ion concentration on a positive electrode side by a higher degree of discharging relative to charging than a predetermined level in the course of charge-discharge of the secondary battery 130 during a certain time period. It is known that continuing such an over-discharge state causes degradation of the battery performance of the secondary battery.

According to the embodiment, the decision value is an integrated value by integrating an evaluation value that is obtained at regular intervals since an initial state of the secondary battery 130. The evaluation value is calculated by using an estimated value that estimates the degree of a decrease in localization of the ion concentration with elapse of time and an estimated value that estimates the degree of an increase in localization of the ion concentration accompanied with charge and discharge of the secondary battery 130. For example, a method described in JP 2017-129409A may be used as a concrete calculation method of the evaluation value and the integrated value. The method employed to determine the over-discharge state is not limited to the method using the integrated value by integrating the evaluation value but may be any other method that is capable of estimating the localization of the ion concentration in the electrolytic solution.

The secondary battery converter 140 is a step-up/down-type converter unit. The secondary battery converter 140 is electrically connected with the DC conductor W2 via the DC conductor W4. The DC conductor W2 is arranged to connect the fuel cell converter 120 with the inverter 150. The secondary battery converter 140 is configured to regulate the voltage in the DC conductor W2 that is an input voltage of the inverter 150 and to control charge and discharge of the secondary battery 130.

When the output power from the fuel cell converter 120 is insufficient relative to a target output power, the secondary battery converter 140 causes the secondary battery 130 to be discharged. When regenerative power is generated in the drive motor 200, on the other hand, the secondary battery converter 140 causes the regenerative power to be accumulated in the secondary battery 130.

The inverter 150 is configured to convert the DC power supplied from the fuel cell 100 and the secondary battery 130 via the DC conductor W2 into three-phase AC power. The inverter 150 is electrically connected with the drive motor 200 via the AC conductor W5 to supply the three-phase AC power to the drive motor 200. The inverter 150 also serves to convert the regenerative power generated in the drive motor 200 into DC power and output the DC power to the DC conductor W2. The drive motor 200 is a motor configured to convert the three-phase AC power supplied from the inverter 150 into a rotating power.

The controller 160 is configured to receive signals output from various sensors provided in the fuel cell system 10 and to control a power supply circuit. The power supply circuit herein denotes a circuit including the fuel cell 100, the cooling medium circulation system 110, the fuel cell converter 120, the secondary battery 130, the secondary battery converter 140 and the inverter 150. The controller 160 causes electric power to be supplied from the fuel cell 100 and the secondary battery 130 to a load, in response to a required power of the load. The load includes, for example, the drive motor 200 and various electric power devices used during operation of the vehicle, such as a lighting device, an air conditioner and a hydraulic pump. The required power is determined according to the driver's operation and the vehicle speed by a main ECU 300 provided in the vehicle. The controller 160 is notified of the determined required power.

When the decision value sent from the decision value acquirer 135 is equal to or greater than a predetermined reference value, the controller 160 imposes a limitation on discharge of the secondary battery 130, with a view to reducing degradation of the battery performance of the secondary battery 130. The predetermined reference value herein is a criterion value used such that the state of the secondary battery 130 is regarded as the over-discharge state when the decision value is equal to or greater than the reference value. According to the embodiment, when the integrated value used as the decision value is a positive value, the state of the secondary battery 130 is regarded as the over-discharge state, so that the reference value is equal to 0.

When the decision value is equal to or greater than the predetermined reference value and the required power decreases, the controller 160 imposes a limitation on a decrease in output power of the fuel cell 100 and causes the secondary battery 130 to be charged with an amount of electric power corresponding to the limitation imposed on the decrease in output power of the fuel cell 100. The details of this process are described below with reference to FIG. 3 and FIG. 4.

The controller 160 performs a discharge limitation recovery process including a process of determining the over-discharge state as described below. Such control reduces the possibility of occurrence of the shortage of the overall output power of the fuel cell system 10 for the required power, while restraining the secondary battery 130 from continuing the over discharge state.

A2. Discharge Limitation Recovery Process

Figure 3:
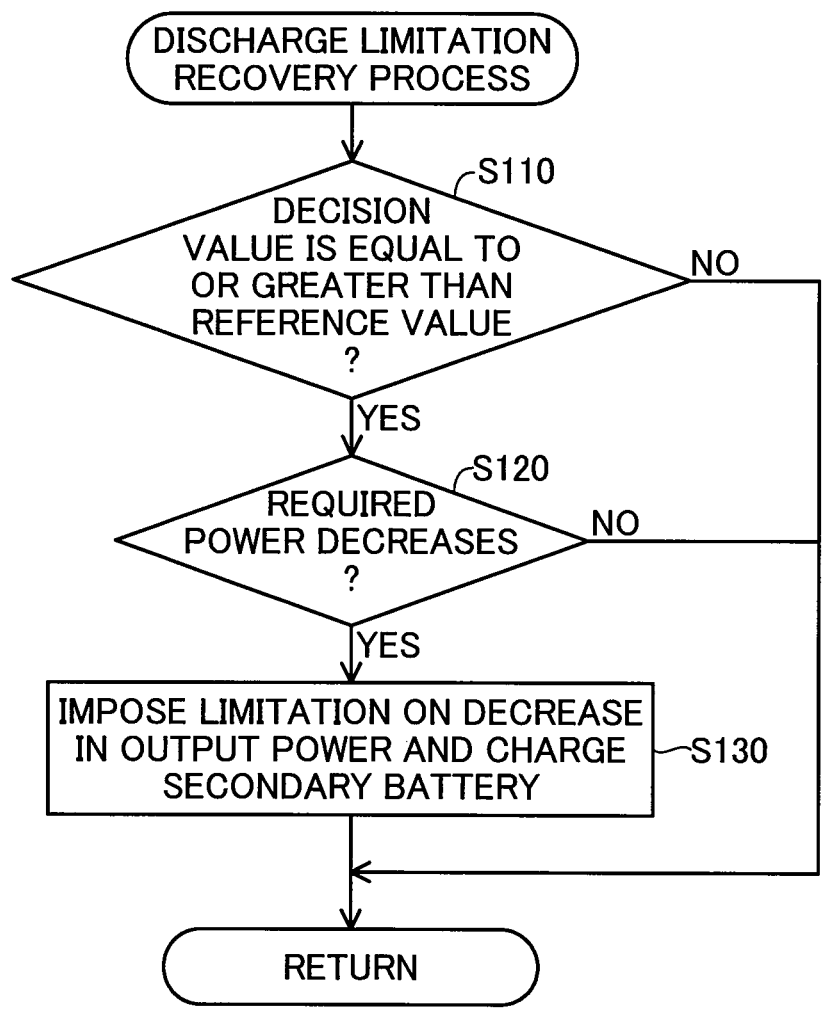
FIG. 3 is a flow diagram showing a discharge limitation recovery process.

FIG. 3 is a flow diagram showing a discharge limitation recovery process performed by the controller 160. The discharge limitation recovery process is a process of recovering the secondary battery 130 in the over-discharge state and thereby restoring the discharge limitation of the secondary battery 130. The discharge limitation recovery process is performed continually for a time period from an on operation to an off operation of an ignition switch (not shown) provided in the vehicle with the fuel cell system 10 mounted thereon.

When the discharge limitation recovery process is triggered, the controller 160 first determines whether the decision value sent from the decision value acquirer 135 is equal to or greater than the reference value (step S110). When it is determined that the decision value is not equal to or greater than the reference value (step S110: NO), the controller 160 returns the flow to step S110.

When it is determined that the decision value is equal to or greater than the reference value (step S110: YES), on the other hand, the controller 160 subsequently determines whether the required power from the load decreases (step S120). When it is determined that the required power from the load does not decrease (step S120: NO), the controller 160 returns the flow to step S110.

When it is determined that the required power from the load decreases (step S120: YES), on the other hand, the controller 160 imposes a limitation on a decrease in output power of the fuel cell 100 in response to a decrease in the required power and causes the secondary battery 130 to be charged with an entire amount of electric power corresponding to the limitation imposed on the decrease in the output power of the fuel cell 100 (step S130). According to the embodiment, imposing a limitation on a decrease in output power of the fuel cell 100 in response to a decrease in the required power means maintaining the amount of output power of the fuel cell 100 at a level immediately before the start of the decrease in response to the decrease in the required power. With regard to the limitation imposed on the decrease in the output power of the fuel cell 100, the fuel cell system 10 of the embodiment maintains the amount of output power at the level immediately before the start of the decrease and thereby prevents any decrease in amount of the output power. The set degree of the limitation may, however, be appropriately changed. The controller 160 controls the supplies of hydrogen and oxygen to the fuel cell 100 and controls the secondary battery converter 140 and the like to implement the processing of step S130. The controller 160 then returns the flow to step S110.

Figure 4:
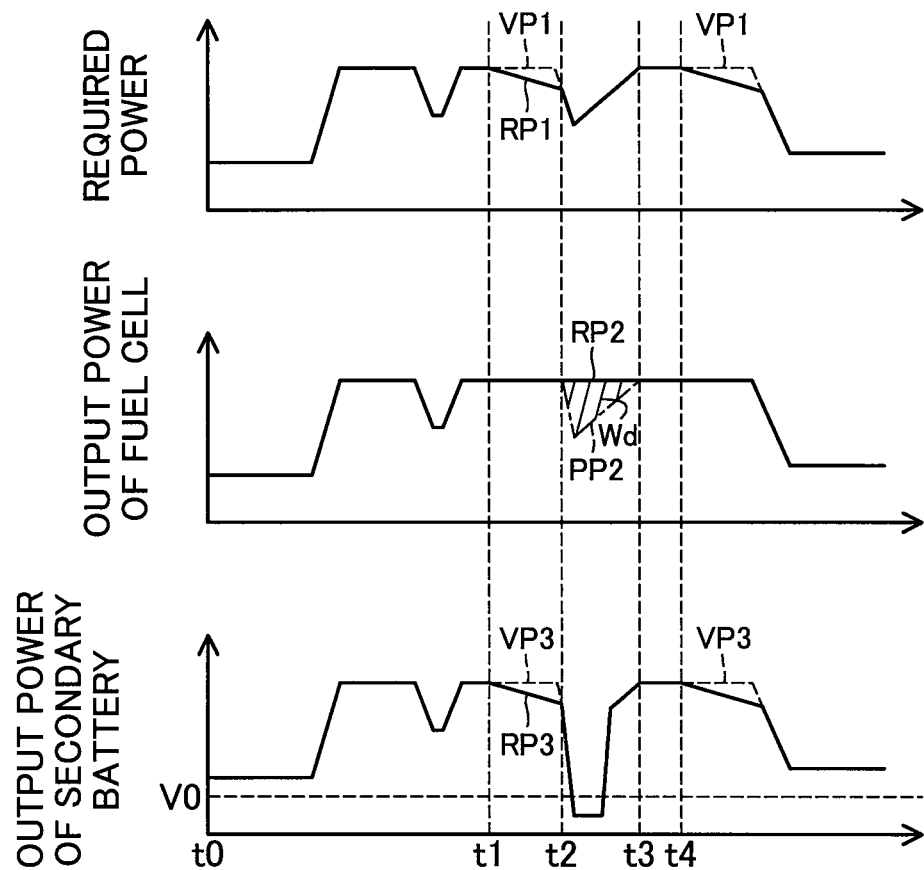
FIG. 4 is a diagram illustrating variations in output power of a fuel cell and output power of a secondary battery according to the embodiment.

FIG. 4 is a diagram illustrating variations in output power of the fuel cell 100 and output power of the secondary battery 130 with a variation in required power in the fuel cell system 10. In the respective graphs shown in FIG. 4, the abscissa indicates the time. In FIG. 4, an upper graph shows a variation in the required power. A middle graph shows a variation in the output power of the fuel cell 100. A lower graph shows a variation in the output power of the secondary battery 130. A voltage V0 in the lower graph of FIG. 4 indicates 0 V.

The following describes respective line graphs shown in FIG. 4. A broken-line graph VP1 indicates a variation in amount of the required power of the load. A solid-line graph RP1 indicates a variation in amount of output power that is actually output from the fuel cell system 10 in response to a request. A solid-line graph RP2 indicates a variation in amount of output power of the fuel cell 100. A broken-line graph VP3 indicates a variation in amount of electric power that is to be output from the secondary battery 130 in response to the required power. A solid-line graph RP3 indicates a variation in amount of electric power that is actually output from the secondary battery 130. A one-dot chain-line graph PP2 will be described later.

The fuel cell 100 and the secondary battery 130 output electric power during a time period from a timing t0 to a timing t1, so as to sufficiently supply the electric power in response to the required power. During this time period, the secondary battery 130 is not charged but is continuously discharged to approach to the over-discharge state.

At the timing t1, the decision value becomes equal to or greater than the reference value, and the secondary battery 130 falls into the over-discharge state. The controller 160 accordingly starts imposing a limitation on discharge from the secondary battery 130.

During a time period from the timing t1 to a timing t2, the secondary battery 130 is predicted to output the amount of electric power indicated by the broken-line graph VP3 in response to the required power but is allowed to output only the amount of electric power indicated by the solid-line graph RP3 due to the limitation of discharge by the controller 160. Accordingly, the fuel cell system 10 actually outputs the amount of electric power shown by the solid-line graph RP1, although the load requires the amount of electric power shown by the broken-line graph VP1.

At the timing t2, the required power starts decreasing. The required power decreases, for example, in response to a reduction in accelerator position of the vehicle. As described above, since the decision value is equal to or greater than the reference value (step S110: YES) and the required power decreases (step S120: YES) at the timing t2, the processing of step S130 is performed to impose a limitation on a decrease in output power of the fuel cell 100 and maintain the amount of output power of the fuel cell 100 at the level immediately before the start of the decrease in response to the decrease in the required power, as shown by the solid-line graph RP2. The one-dot chain-line graph RP2 indicates a variation in output power when no limitation is imposed on a decrease in output power of the fuel cell even when the required power decreases.

During a time period from the timing t2 to a timing t3, when the limitation is imposed on the decrease in output power of the fuel cell 100, the controller 160 controls the secondary battery converter 140 to cause the secondary battery 130 to be charged with the entire electric power corresponding to the limitation imposed on the decrease in output power of the fuel cell 100. The solid-line graph RP3 below the voltage V0 indicates the state that the secondary battery 130 is charged. Charging part of the output power of the fuel cell 100 causes the decision value to become smaller than the reference value and recovers the secondary battery 130 from the over-discharge state.

The amount of electric power used to charge the secondary battery 130 may be all or part of the electric power corresponding to the limitation imposed on the decrease in output power of the fuel cell 100. According to the embodiment, the amount of output power of the fuel cell 100 used to charge the secondary battery 130 is the entire amount of electric power corresponding to the limitation imposed on the decrease in output power of the fuel cell 100 as described above. In FIG. 4, this amount of electric power corresponds to an amount of electric power Wd that is a difference between the solid-line graph RP2 and the one-dot chain-line graph PP2 during the time period from the timing t2 to the timing t3. Accordingly, the fuel cell system 10 restrains the secondary battery 130 from continuing the over-discharge state, while ensuring the amount of output power of the fuel cell 100 in response to the required power.

During the time period from the timing t2 to the timing t3, when the required power changes from the decrease to an increase, the controller 160 controls the secondary battery converter 140 to change over the state of the secondary battery 130 from the charging state to the discharging state.

During a time period from the timing t3 to the timing t4, the fuel cell 100 and the secondary battery 130 sufficiently supply electric power in response to the required power.

At the timing t4, the decision value becomes equal to or greater than the reference value, and the secondary battery 130 again falls into the over-discharge state. The controller 160 accordingly starts imposing a limitation on discharge from the secondary battery 130.

Figure 5:
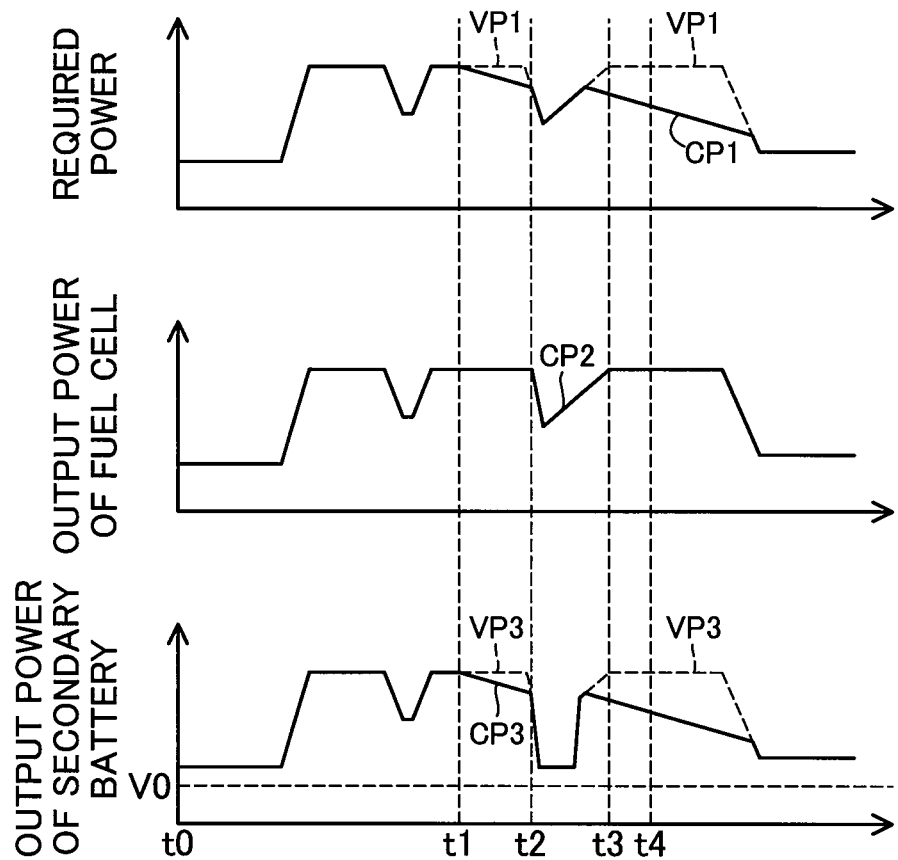
FIG. 5 is a diagram illustrating variations in output power of a fuel cell and output power of a secondary battery according to a comparative example.

FIG. 5 is a diagram illustrating variations in output power of a fuel cell and output power of a secondary battery with a variation in required power in a fuel cell system according to a comparative example 1. The fuel cell system of the comparative example 1 has a configuration similar to the configuration of the fuel cell system 10 of the first embodiment, except that no limitation is imposed on a decrease in output power of the fuel cell even when the required power decreases. Accordingly, the fuel cell system of the comparative example 1 does not charge the secondary battery even when the required power decreases. In the description below, the fuel cell system of the comparative example 1 is simply called the comparative example 1. In the respective graphs shown in FIG. 5, the abscissa indicates the time. In FIG. 5, an upper graph shows a variation in the required power. A middle graph shows a variation in the output power of the fuel cell. A lower graph shows a variation in the output power of the secondary battery. A broken-line graph VP1 and a broken-line graph VP3 shown in FIG. 5 are identical with the broken-line graph VP1 and the broken-line graph VP3 shown in FIG. 3. Timings t1 to t4 in FIG. 5 are identical with the timings t1 to t4 in FIG. 3.

The following describes a solid-line graph CP1, a solid-line graph CP2 and a solid-line graph CP3 shown in FIG. 5. The solid-line graph CP1 indicates an amount of actually output power in response to a required power in the comparative example 1. The solid-line graph CP2 indicates an amount of output power of the fuel cell in the comparative example 1. The solid-line graph CP3 indicates an amount of electric power output from the secondary battery in the comparative example 1.

During a time period from a timing t2 to a timing t3, the comparative example 1 does not impose a limitation on a decrease in output power of the fuel cell even when the required power decreases, as shown by the solid-line graph CP2. In other words, the comparative example 1 decreases the output of the fuel cell in response to a decrease in the required power.

During the time period from the timing t2 to the timing t3, the comparative example 1 does not charge the secondary battery, as shown by the solid-line curve CP3. Accordingly, the secondary battery is not recovered from the over-discharge state.

During the time period from the timing t2 to the timing t3, when the required power changes from the decrease to an increase, a controller of the comparative example 1 controls a secondary battery converter, in order to increase the amount of output power from the secondary battery. The secondary battery is, however, not recovered from the over-discharge state and is under limitation of discharge. The secondary battery is accordingly not capable of sufficiently responding to the required power, as shown by the solid-line graph CP3. Moreover, the stricter limitation is imposed on discharge of the secondary battery with progress of the over-discharge state, as shown by the solid-line graph CP3. The amount of actually output power in response to the required power accordingly decreases, as shown by the solid-line graph CP1.

As shown in FIG. 5, the comparative example 1 has a shorter time period when electric power is sufficiently supplied in response to a request from the load, compared with the fuel cell system 10 of the first embodiment. The fuel cell system 10 of the first embodiment, on the other hand, charges the secondary battery 130 with the output power from the fuel cell 100 as the positive measure to recover the secondary battery 130 from the over-discharge state and thereby extends the time period when electric power is sufficiently supplied in response to the request from the load.

As described above, when the decision value is equal to or greater than the reference value, i.e., when the secondary battery 130 is in the over-discharge state, the configuration of the first embodiment charges the secondary battery 130 with the output power from the fuel cell 100. This configuration restrains the secondary battery 130 from continuing the over-discharge state. The electric power used to charge the secondary battery 130 is covered by the electric power corresponding to the limitation imposed on the decrease in output power of the fuel cell 100. This configuration reduces the possibility of occurrence of the shortage of the overall output power of the fuel cell system 10 for the required power.

B. Second Embodiment

B1. System Configuration

Figure 6:
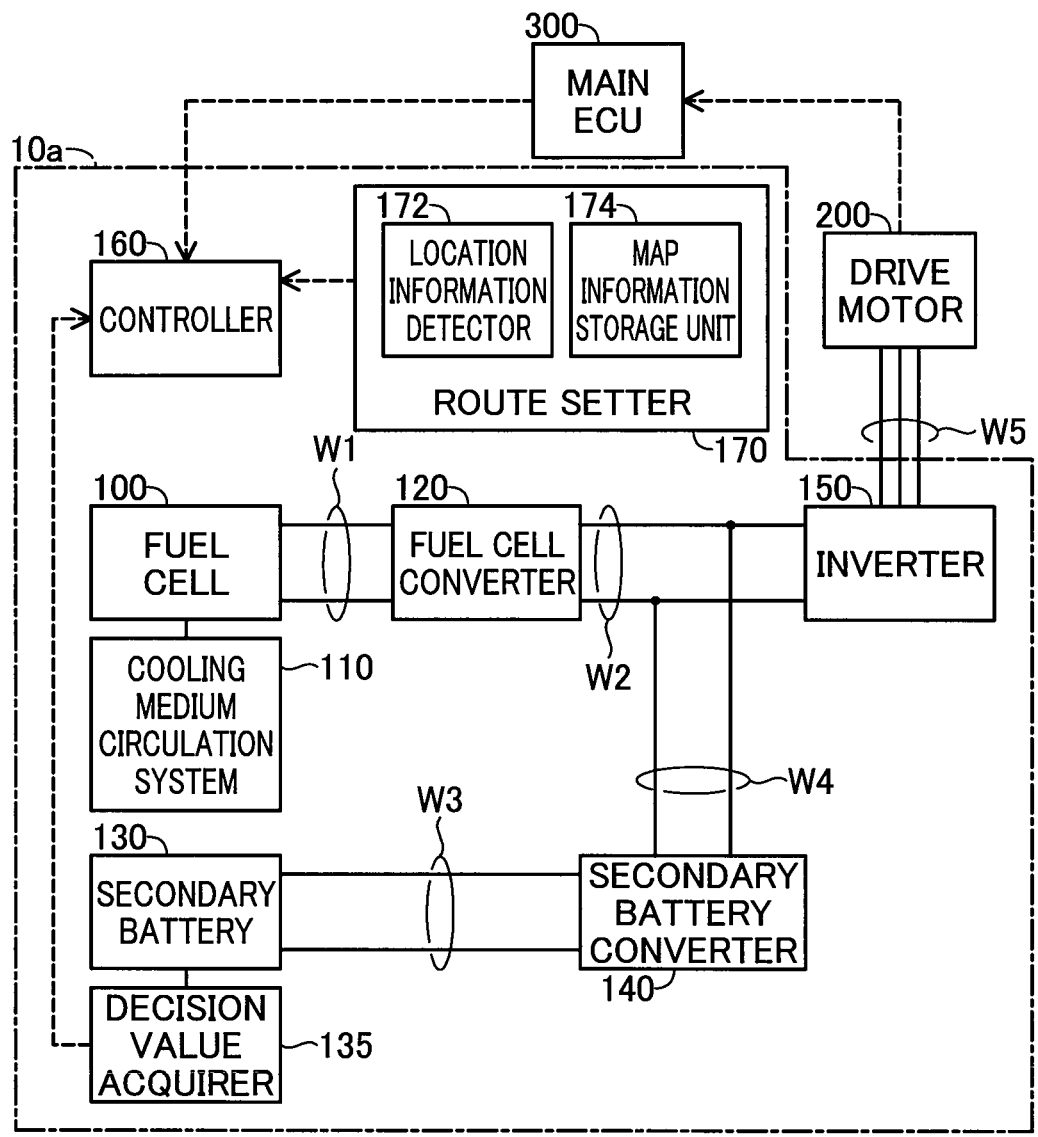
FIG. 6 is a diagram illustrating the configuration of a fuel cell system according to a second embodiment.

FIG. 6 is a diagram illustrating the configuration of a fuel cell system 10*a* according to a second embodiment. The fuel cell system 10*a* differs from the fuel cell system 10 of the first embodiment by that the fuel cell system 10*a* is provided with a route setter 170. The fuel cell system 10*a* is used as a power source of a vehicle that is driven by the drive motor 200, like the fuel cell system 10 of the first embodiment.

The route setter 170 is configured as a car navigation system to display a route and perform voice guidance by means of a display and a speaker provided in a passenger room of a vehicle with the fuel cell system 10*a* mounted thereon. The route setter 170 is configured to set a scheduled drive route, based on location information of the vehicle and map information. The route setter 170 includes a location information detector 172 and a map information storage unit 174.

The location information detector 172 is configured to detect the location information of the vehicle with the fuel cell system 10a mounted thereon. For example, the location information detector 172 may detect the location information of the vehicle by using GNSS (global navigation satellite system). The map information storage unit 174 is configured to store the map information. The map information includes, for example, various features to be expressed on the map. The features include, for example, artificial constructions such as buildings and roads and natural objects such as mountains, rivers, plants and trees. Related information to components of the map information include various information to be recorded as the map information with regard to the components. For example, when the feature is a building, the related information includes the shape, the width, the depth and the height of the building, a height difference from a road facing the building, the location of an entrance, the configuration of a site where the building is located, the width of the site, the depth of the site, the postal address, the lot number and information on residents. When the feature is a road, the related information includes the shape, the width, the length, the height, the name, and the type of the road (national road, prefectural road or local road), the number of lanes, the presence or absence of a medial divider, the presence or absence of a sidewalk, the presence or absence of traffic lights, and the presence or absence of lateral grooves.

According to the second embodiment, the controller 160 performs a discharge limitation restraining process, in addition to the discharge limitation recovery process described above with reference to FIG. 3. When the decision value is predicted to become equal to or greater than the reference value, the second embodiment performs this discharge limitation restraining process to charge the secondary battery 130 in advance with the output power from the fuel cell 100 and thereby restrains the secondary battery 130 from falling into the over-discharge state.

B2. Discharge Limitation Restraining Process

Figure 7:
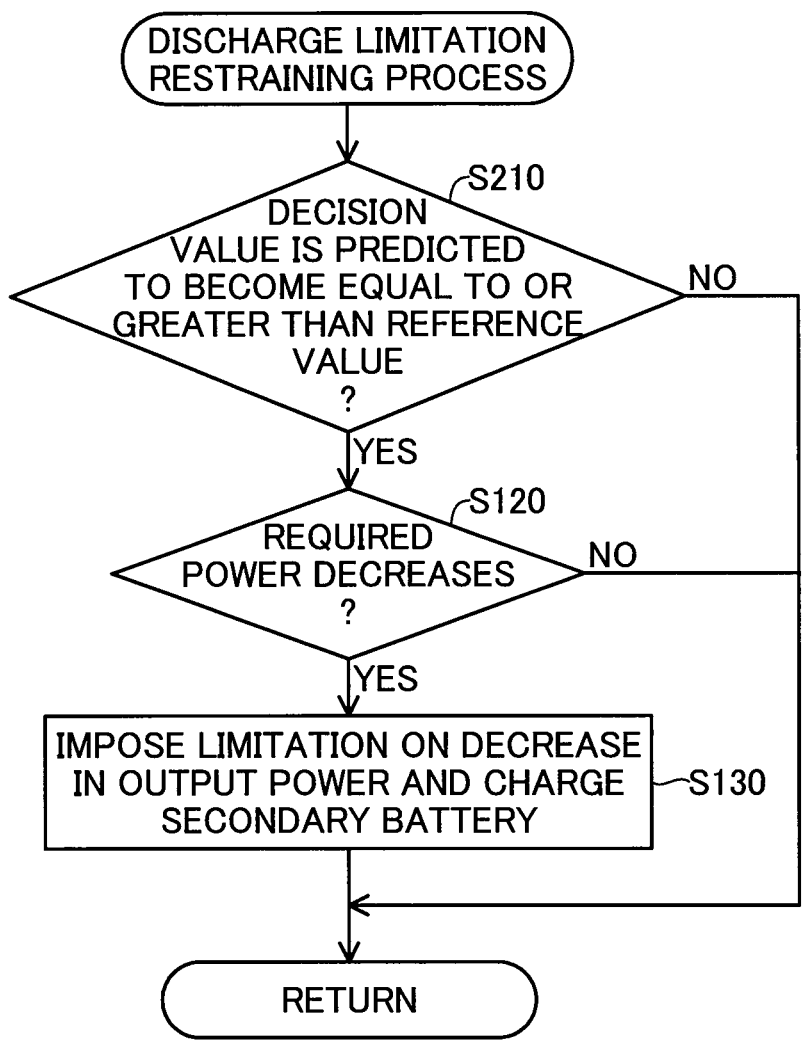
FIG. 7 is a flow diagram showing a discharge limitation restraining process according to the second embodiment.

FIG. 7 is a flow diagram showing a discharge limitation restraining process according to the second embodiment. The discharge limitation restraining process is performed continually for a time period from an on operation to an off operation of an ignition switch (not shown) provided in the vehicle with the fuel cell system 10a mounted thereon.

When the discharge limitation restraining process is triggered, the controller 160 determines whether the decision value is predicted to become equal to or greater than the reference value in a scheduled drive route set by the route setter 170 (step S210). The location information of the vehicle detected by the location information detector 172 and the map information read from the map information storage unit 174 are used for this determination.

According to the embodiment, the determination of whether the decision value is predicted to become equal to or greater than the reference value in the scheduled drive route is based on determination of whether an uphill road is included in the scheduled drive route.

The uphill road is a road that has an ascending slope of 5 m or more relative to a horizontal distance of 100 m and has a length of 100 m or longer. Including the uphill road in the scheduled drive route means that the decision value is predicted to become equal to or greater than the reference value in the uphill road and that the secondary battery 130 is predicted to fall into the over-discharge state.

When the decision value is not predicted to become equal to or greater than the reference value, i.e., when it is determined that no uphill road is included in the scheduled drive route (step S210: NO), the controller 160 returns the flow to step S210.

When the decision value is predicted to become equal to or greater than the reference value, i.e., when it is determined that an uphill road is included in the scheduled drive route (step S210: YES), on the other hand, the controller 160 performs processing of steps S120 and S130, which is similar to the processing of steps S120 and S130 in the discharge limitation recovery process described above with reference to FIG. 3.

As described above, when the decision value is predicted to become equal to or greater than the reference value in the scheduled drive route, the configuration of the second embodiment charges the secondary battery 130 in advance with the output power from the fuel cell 100. This configuration restrains the secondary battery 130 from falling into the over-discharge state during a run in the scheduled drive route and suppresses in advance a limitation from being imposed on discharge of the secondary battery 130, due to the over-discharge state.

C. Third Embodiment

C1. System Configuration

A fuel cell system according to a third embodiment has a similar configuration to that of the fuel cell system 10a of the second embodiment. The fuel cell system of the third embodiment is also used as a power source of a vehicle that is driven by a drive motor 200. The fuel cell system of the third embodiment performs a discharge limitation restraining process different from that performed by the fuel cell system 10a of the second embodiment. In the fuel cell system of the third embodiment, the fuel cell 100 is set to have an output limitation when the temperature of the cooling medium detected by the upstream-side temperature sensor 118a reaches a high temperature HT. The high temperature HT denotes a temperature of the cooling medium reflecting the temperature of the fuel cell 100 that is predicted to have a poor power generation efficiency.

C2. Discharge Limitation Restraining Process

Figure 8:
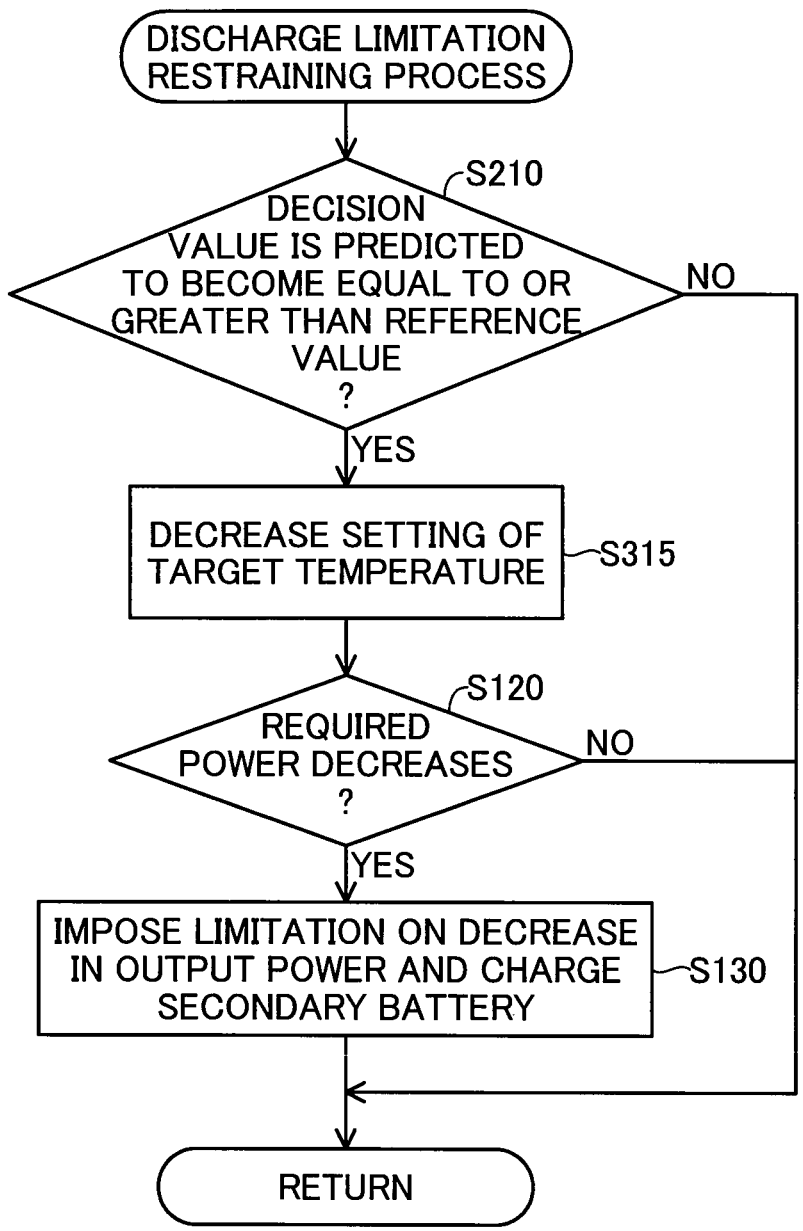
FIG. 8 is a flow diagram showing a discharge limitation restraining process according to a third embodiment.

FIG. 8 is a flow diagram showing a discharge limitation restraining process according to the third embodiment. The discharge limitation restraining process performed in the third embodiment additionally includes step S315 between step S210 and step S120 in the discharge limitation restraining process described above with reference to FIG. 7. When the decision value is predicted to become equal to or greater than the reference value (step S210: YES), the controller 160 decreases the setting of a target temperature used as an indication when the radiator 114 cools down the cooling medium (step S315). More specifically, the controller 160 changes the setting from a first target temperature Wt1 that is a target temperature of default setting to a second target temperature Wt2 that is lower than the first target temperature Wt1 to decrease the setting of the target temperature. When the setting of the target temperature is already changed to the second target temperature Wt2 in a previous cycle of the discharge limitation restraining process, the controller 160 keeps the setting of the target temperature at the second target temperature Wt2 at step S315.

Figure 9:
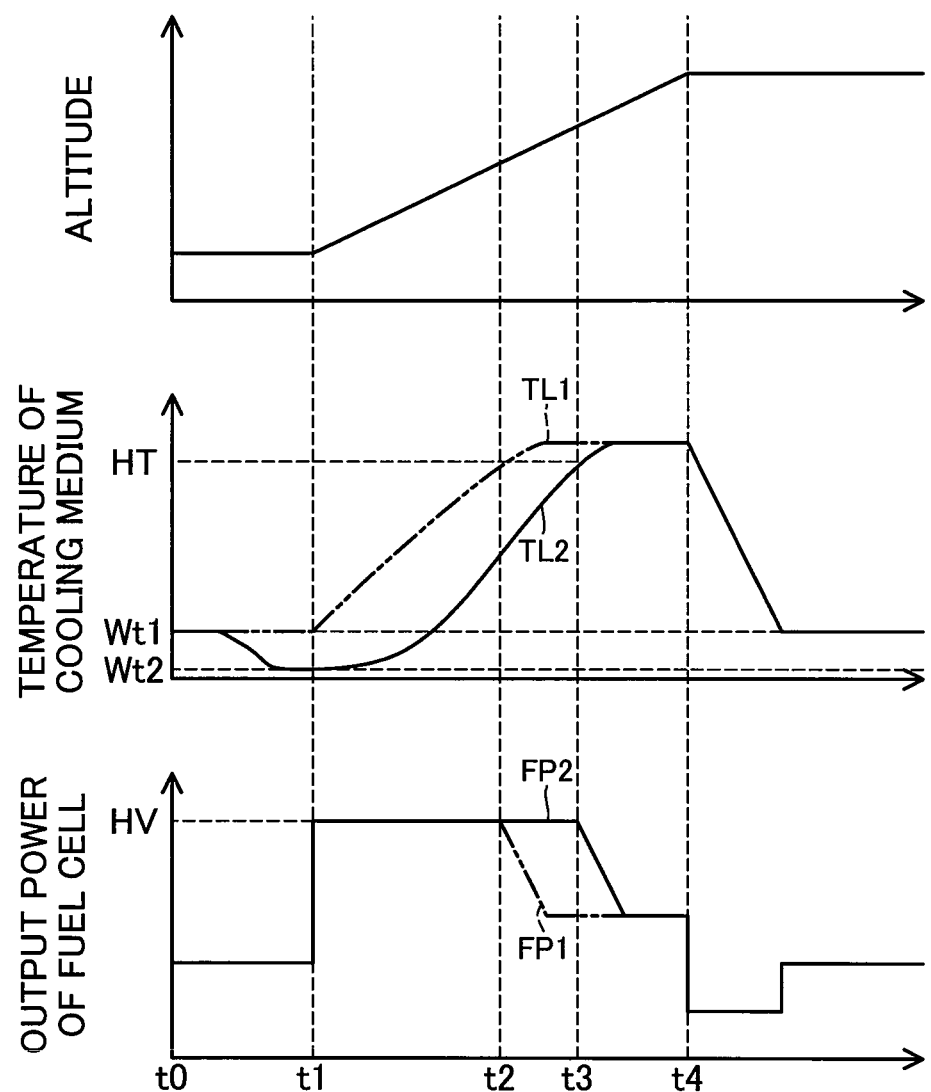
FIG. 9 is diagram illustrating a variation in output power of a fuel cell with a variation in temperature of a cooling medium.

FIG. 9 is a diagram illustrating a variation in output power of the fuel cell with a variation in temperature of the cooling medium when the vehicle runs on an uphill road. In the respective graphs shown in FIG. 9, the abscissa indicates the time. In FIG. 9, an upper graph shows a variation in altitude at the location of the vehicle. A middle graph shows a variation in temperature of the cooling medium. A lower graph shows a variation in output power of the fuel cell.

The following describes respective line graphs shown in FIG. 9. A two-dot chain-line graph TL1 and a two-dot chain-line graph FP1 respectively indicate a variation in temperature of the cooling medium and a variation in output power of a fuel cell in a fuel cell system of a comparative example 2. In the description below, the fuel cell system of the comparative example 2 is simply called the comparative example 2. The comparative example 2 has a configuration similar to the configuration of the fuel cell system of the third embodiment, except that the comparative example 2 does not change the setting of the target temperature but keeps the first target temperature Wt1 even when the decision value is predicted to become equal to or greater than the reference value in the scheduled drive route, i.e., even when it is determined that an uphill road is included in the scheduled drive route. A solid-line graph TL2 and a solid-line graph FP2 respectively indicate a variation in temperature of the cooling medium and a variation in output power of the fuel cell 100 in the fuel cell system of the third embodiment. In FIG. 9, the two-dot chain-line graph TL1 and the two-dot chain-line graph FP1 respectively overlap with the solid-line graph TL2 and the solid-line graph FP2, except portions separated from the solid-line graph TL2 and the solid-line graph FP2.

Both a vehicle with the fuel cell system of the third embodiment mounted thereon and a vehicle with the comparative example 2 mounted thereon run on a flat road with no change in altitude during a time period from a timing t0 to a timing t1. During a time period from the timing t1 to a timing t4, the respective vehicles run on an uphill road with a gradual increase in altitude.

For convenience of explanation, the vehicle with the comparative example 2 mounted thereon is described first. Prior to the timing t1 when the vehicle starts running on the uphill road, the temperature of the cooling medium is the first target temperature Wt1. When the vehicle starts running on the uphill road at the timing t1, there is an increase in required power that is required from a load. The electric power output from the fuel cell accordingly rises to a high power HV as shown by the two-dot chain-line graph FP1 overlapping with the solid-line graph FP2. The temperature of the cooling medium also starts rising from the first target temperature Wt1, accompanied with an increase in output power of the fuel cell, as shown by the two-dot chain-line graph TL1.

During a time period from the timing t1 to a timing t2, the vehicle keeps running on the uphill road. The electric power output from the fuel cell is accordingly kept at the high power HV, as shown by the two-dot chain-line graph FP1 overlapping with the solid-line graph FP2. The temperature of the cooling medium is also kept rising, as shown by the two-dot chain-line graph TL1.

When the temperature of the cooling medium reaches the high temperature HT at the timing t2, a discharge limitation is imposed on the fuel cell. The output power from the fuel cell under the discharge limitation decreases during a time period from the timing t2 to a timing t3, as shown by the two-dot chain-line graph FP1.

When the vehicle terminates running on the uphill road at the timing t4, the output power from the fuel cell decreases, as shown by the two-dot chain-line graph FP1 overlapping with the solid-line graph FP2. The temperature of the cooling medium starts decreasing, accompanied with a decrease in the output power from the fuel cell, as shown by the two-dot chain-line graph TL1 overlapping with the solid-line graph TL2. The temperature of the cooling medium is then returned to the first target temperature Wt1.

The following describes the vehicle with the fuel cell system of the third embodiment mounted thereon. When the decision value is predicted to become equal to or greater than the reference value in the scheduled drive route, i.e., when it is determined that an uphill road is included in the scheduled drive route, the fuel cell system of the third embodiment controls the cooling medium circulation system 110 to decrease the temperature of the fuel cell 100. More specifically, the controller 160 controls the cooling medium circulation system 110 to change the setting of the target temperature from the first target temperature Wt1 to the second target temperature Wt2, so as to decrease the temperature of the cooling medium. Prior to the timing t1 when the vehicle starts running on the uphill road, the temperature of the cooling medium is accordingly decreased to the second target temperature Wt2 that is lower than the first target temperature Wt1.

The vehicle starts running on the uphill road at the timing t1 and keeps running on the uphill road during the time period from the timing t1 to the timing t2. Like the comparative example 2, the output power from the fuel cell 100 is kept at the high power HV as shown by the solid-line graph FP2. The temperature of the cooling medium is, on the other hand, decreased to the second target temperature Wt2 prior to the timing t1. A temperature increase accordingly starts from the temperature lower than the first target temperature Wt1, as shown by the solid-line graph TL2. In the fuel cell system of the third embodiment, unlike the comparative example 2, the temperature of the cooling medium does not reach the high temperature HT at the timing t2. The temperature of the cooling medium reaches the high temperature HT at the later timing in the fuel cell system of the third embodiment than the timing t2 when the temperature of the cooling medium reaches the high temperature HT in the comparative example 2. The output power from the fuel cell 100 is accordingly kept at the high power HV during the time period from the timing t2 to the timing t3, as shown by the solid-line graph FP2.

At the timing t3, the temperature of the cooling medium reaches the high temperature HT, as shown by the solid-line graph TL2. When the temperature of the cooling medium reaches the high temperature HT at the timing t3, a discharge limitation is imposed on the fuel cell 100. The fuel cell 100 under the discharge limitation decreases the output power during the time period from the timing t3 to the timing t4, as shown by the solid-line graph FP2.

The variations at and after the timing t4 are identical with those in the case of the comparative example 2 and are not specifically described. The fuel cell system of the third embodiment returns the setting of the target temperature from the second target temperature Wt2 to the first target temperature Wt1 after the vehicle terminates running on the uphill road after detection of the presence of the uphill road. At and after the timing t4, the temperature of the cooling medium is accordingly returned to the first target temperature Wt1.

When the decision value is predicted to become equal to or greater than the reference value in the scheduled drive route and the required power decreases, the fuel cell system of the third embodiment imposes a limitation on a decrease in output power of the fuel cell 100 and causes the secondary battery 130 to be charged with part of the output power. The fuel cell system of the third embodiment is likely to increase the workload of the fuel cell 100, compared with a fuel cell system equipped with a fuel cell having no limitation on a decrease in output power. The fuel cell system of the third embodiment is thus likely to have a temperature rise of the fuel cell at the earlier timing, compared with the fuel cell system equipped with the fuel cell having no limitation on the decrease in output power. When the decision value is predicted to become equal to or greater than the reference value in the scheduled drive route, however, the fuel cell system of the third embodiment controls the cooling medium circulation system 110 to decrease the temperature of the fuel cell 100 in advance, thereby suppressing a temperature rise of the fuel cell 100, accompanied with the limitation imposed on the decrease in output power of the fuel cell 100.

D. Fourth Embodiment

D1. System Configuration

Figure 10:
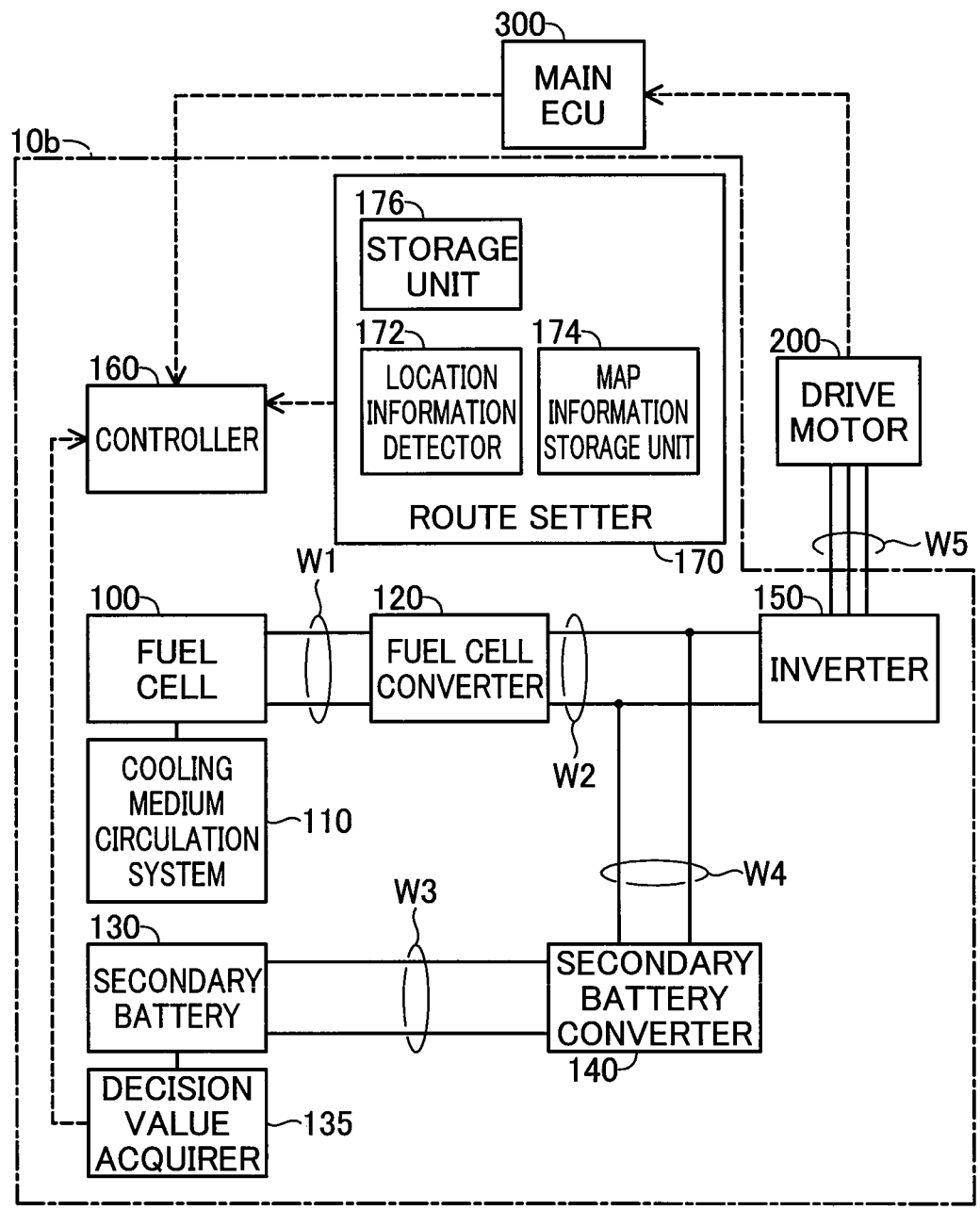
FIG. 10 is a diagram illustrating the configuration of a fuel cell system according to a fourth embodiment.

FIG. 10 is a diagram illustrating the configuration of a fuel cell system 10b according to a fourth embodiment. The fuel cell system 10b differs from the fuel cell system 10a of the second embodiment shown in FIG. 6 by that the route setter 170 includes a storage unit 176. The fuel cell system 10b is used as a power source of a vehicle that is driven by the drive motor 200, like the fuel cell system 10a.

The storage unit 176 is configured to store a driving record of the vehicle with the fuel cell system 10b mounted thereon. The driving record includes sections of caution where the decision value became equal to or greater than the reference value during a past run of the vehicle.

A discharge limitation restraining process performed in the fourth embodiment is similar to the discharge limitation restraining process of the second embodiment described above with reference to FIG. 7, except that the determination of whether the decision value is predicted to become equal to or greater than the reference value at step S210 is based on determination of whether or not any section of caution is included in the scheduled drive route.

When the vehicle runs in a section of caution stored in the driving record, it is highly likely that the secondary battery falls into the over-discharge state.

The configuration of the fourth embodiment described above suppresses the secondary battery from falling into the over-discharge state with the high accuracy.

E. Other Embodiments

According to the second embodiment, the fuel cell system 10a additionally includes the location information detector 172 and the map information storage unit 174, and the controller 160 performs the discharge limitation restraining process, based on the location information detected by the location information detector 172 and the map information stored in the map information storage unit 174. The present disclosure is, however, not limited to this configuration. For example, in a modified configuration of a fuel cell system that additionally includes only the location information detector 172, according to a modification, the controller 160 may receive map information stored in a server and perform the discharge limitation restraining process, based on the received map information and the location information detected by the location information detector 172. According to another modification, a server may receive the location information detected by the location information detector 172 in the fuel cell system of this modified configuration and detect information regarding uphill roads by referring to the map information stored in the server. The controller 160 included in the fuel cell system may receive the information regarding the uphill roads from the server and perform the discharge limitation restraining process.

In the second embodiment and the fourth embodiment, the fuel cell system includes the route setter 170. The present disclosure is, however, not limited to this configuration. For example, the route setter 170 may be provided in a vehicle with a fuel cell system mounted thereon. In this modified configuration, a controller of the fuel cell system may control the power supply circuit, based on the location information, the map information and the driving record sent from the vehicle to the controller.

The disclosure is not limited to any of the embodiment and its modifications described above but may be implemented by a diversity of configurations without departing from the scope of the disclosure. For example, the technical features of any of the above embodiments and their modifications may be replaced or combined appropriately, in order to solve part or all of the problems described above or in order to achieve part or all of the advantageous effects described above. Any of the technical features may be omitted appropriately unless the technical feature is described as essential in the description hereof. The present disclosure may be implemented by aspects described below.

(1) According to one aspect of the present disclosure, there is provided a fuel cell system configured to supply a required power that is required from a load. The fuel cell system comprises a power supply circuit that includes a fuel cell and a secondary battery and is configured to supply electric power from the fuel cell and the secondary battery to the load and to charge the secondary battery with electric power from the fuel cell; a decision value acquirer configured to monitor a charge-discharge state of the secondary battery for obtaining a decision value that is used to determine a degree of localization of an ion concentration in an electrolytic solution included in the secondary battery; and a controller configured to control the power supply circuit according to the decision value. When the decision value becomes equal to or greater than a predetermined reference value, the controller imposes a limitation on discharge of the secondary battery. When the decision value is equal to or greater than the reference value and the required power decreases, the controller imposes a limitation on a decrease in output power of the fuel cell to charge secondary battery with at least part of electric power corresponding to the limitation imposed on the decrease in output power. When the decision value is equal to or greater than the reference value, i.e., when the secondary battery falls into an over-discharge state, the configuration of causing the secondary battery to be charged with the output power of the fuel cell restrains the secondary battery from continuing the over-discharge state. The electric power used to charge the secondary battery is covered by the electric power corresponding to the limitation imposed on the decrease in output power of the fuel cell. This reduces the possibility of occurrence of the shortage of the overall output power of the fuel cell system for the required power.

(2) The fuel cell system according to the above aspect may be mounted on a vehicle. The fuel cell system may further comprise a route setter configured to set a scheduled drive route, based on location information of the vehicle and map information. When the decision value is predicted to become equal to or greater than the reference value in the scheduled drive route and the required power decreases, the controller may impose the limitation on the decrease in output power to charge the secondary battery with at least part of electric power corresponding to the limitation imposed on the decrease in output power. When the decision value is predicted to become equal to or greater than the reference value in the scheduled drive route, the fuel cell system of this configuration enables the secondary battery to be charged in advance with the output power from the fuel cell. This configuration restrains the secondary battery from falling into the over-discharge state during running in the scheduled drive route and suppresses in advance a limitation from being imposed on discharge of the secondary battery, due to the over-discharge state.

(3) The fuel cell system according to the above aspect may further comprise a cooling medium circulation system including a radiator configured to cool down a cooling medium of the fuel cell. When the decision value is predicted to become equal to or greater than the reference value in the scheduled drive route, the controller may control the cooling medium circulation system to decrease temperature of the fuel cell. When the decision value is predicted to become equal to or greater than the reference value in the scheduled drive routine, the fuel cell system of this configuration controls the cooling medium circulation system to decrease the temperature of the fuel cell in advance. This configuration suppresses a temperature rise of the fuel cell accompanied with the limitation imposed on the decrease in output power of the fuel cell.

(4) In the fuel cell system according to the above aspect, the controller may obtain information regarding an uphill road included in the scheduled drive route and predict that the decision value becomes equal to or greater than the reference value. When the vehicle runs on an uphill road, it is highly likely that the decision value becomes equal to or greater than the reference value. This configuration suppresses the decision value from becoming equal to or greater than the reference value and thereby restrains the secondary battery from falling into the over-discharge state with high accuracy.

(5) In the fuel cell system according to the above aspect, the route setter may include a storage unit configured to store a driving record that records a section where the decision value became equal to or greater than the reference value during a past run of the vehicle. The controller may predict that the decision value becomes equal to or greater than the reference value in the scheduled drive route, based on the location information, the map information and the driving record. When the vehicle runs in the section recorded in the driving record, it is highly likely that the decision value becomes equal to or greater than the reference value. This configuration suppresses the decision value from becoming equal to or greater than the reference value and thereby restrains the secondary battery from falling into the over-discharge state with high accuracy.

The present disclosure may be implemented by any of various aspects other than the aspects of the fuel cell system described above, for example, a moving body with the fuel cell system mounted thereon, a control method of the fuel cell system, a computer program configured to implement the control method, and a non-transitory storage medium in which such a computer program is stored.

Figure 11:
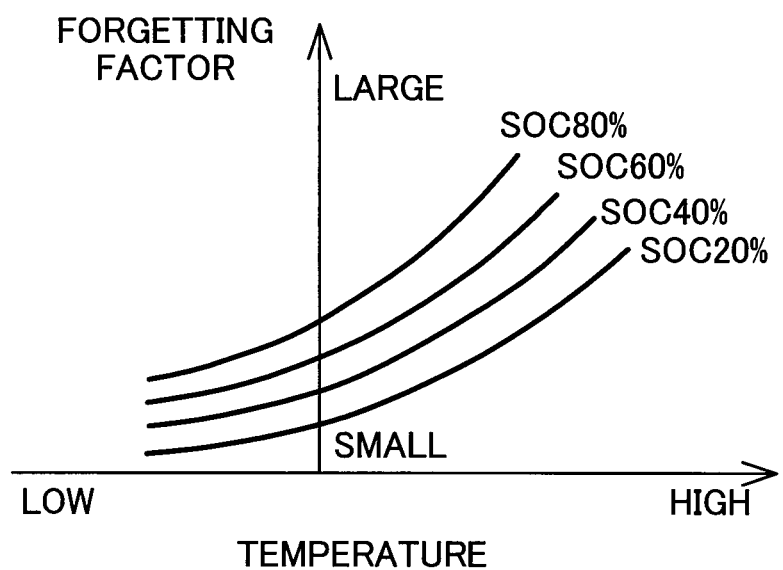
FIG. 11 is a diagram corresponding to FIG. 4 in JP 2017-129409A.
Figure 12:
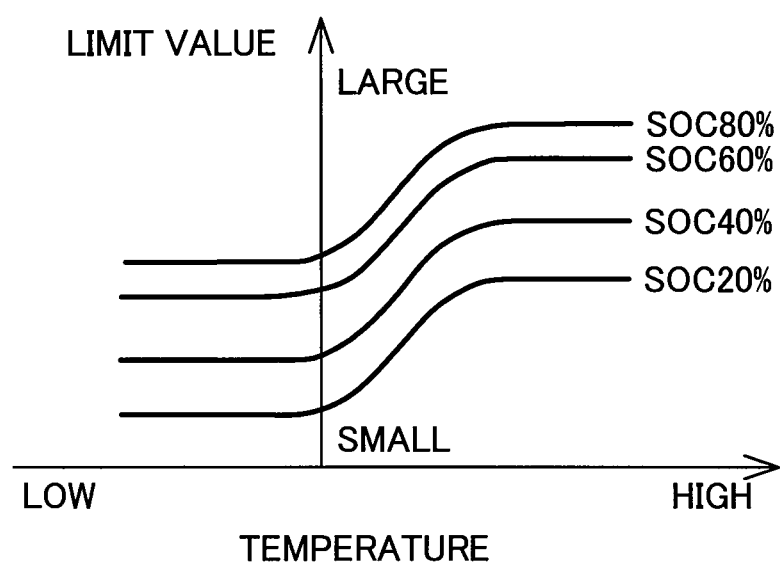
FIG. 12 is a diagram corresponding to FIG. 5 in JP 2017-129409A.
Figure 13:
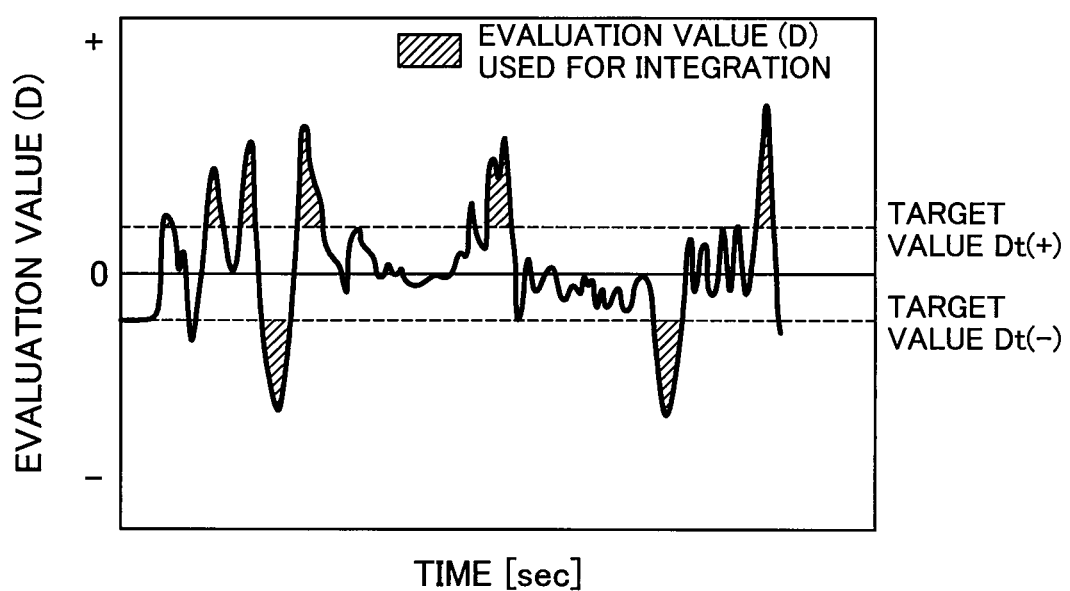
FIG. 13 is a diagram corresponding to FIG. 6 in JP 2017-129409A.

The method described in JP 2017-129409A is mentioned above as the concrete method of calculating the evaluation value and the integrated value. The following reprints the description regarding the method of calculating the evaluation value and the integrated value in JP 2017-129409A. The following paragraphs [0085] to [0097] correspond to the paragraphs [0033] to [0045] in JP 2017-129409A. FIG. 4, FIG. 5 and FIG. 6 referred to in the paragraphs [0085] to [0097] are respectively disclosed as FIG. 11, FIG. 12 and FIG. 13 in the description of the present application.

The following describes a method of estimating a variation in high rate degradation. The battery controller 30 evaluates the high rate state and obtains an evaluation value D(N) at regular intervals, separately from the calculation of the rate of change in state of charge dQ/dV described above, from the initial state of the secondary battery 130 and stores the obtained evaluation value D(N) into the RAM 33. The battery controller 30 integrates the obtained evaluation value D(N) to obtain an integrated value E and estimates a variation in high rate degradation up to the time, based on the integrated value E. The evaluation value D(N) is a value evaluating the degree of reduction in input/output performance of the secondary battery 130 due to localization of the ion concentration and is calculated from the value of electric current flowing in the secondary battery 130.

The evaluation value D(N) is described first. The battery controller 30 repeatedly obtains the evaluation value D(N) indicating the degree of the high rate state at every predetermined cycle time $\Delta t$. In a process of calculating the evaluation value D(N) at a current cycle time, the battery controller 30 calculates a previous evaluation value D(N−1), a decrease D(−) in evaluation value from the previous evaluation value, and an increase D(+) in evaluation value from the previous evaluation value and then calculates a current evaluation value D(N) according to Expression 1 given below:

$$D(N)=D(N-1)-D(-)+D(+) \qquad \text{Expression 1}$$

An initial value D(0) of the evaluation value D(N) of high rate degradation is set to, for example, 0.

The decrease D(−) in evaluation value is a value estimating the degree of reduction in localization of the ion concentration until elapse of one cycle time $\Delta t$ since calculation of the previous evaluation value D(N−1). The localization of the ion concentration decreases to some extent, due to diffusion of ion with elapse of time. For example, the battery controller 30 calculates the decrease D(−) in evaluation value according to Expression 2 given below:

$$D(-)=A \times \Delta t \times D(N-1) \qquad \text{Expression 2}$$

In Expression 2, "A" represents a forgetting factor that is related to the diffusion rate of ion in the electrolytic solution of the secondary battery 130.

The forgetting factor A is determined, based on the SOC of the secondary battery 130 and the temperature of the secondary battery 130. In order to determine the forgetting factor A, the battery controller 30 obtains the temperature and the SOC of the secondary battery 130 in the process of calculation of the evaluation value D(N).

The battery controller 30 obtains, for example, a relationship map of the forgetting factor A to the temperature and the SOC as shown in FIG. 4 by a discharge experiment of the secondary battery 130 and the like and stores the obtained relationship map in the ROM 31. The battery controller 30 determines the forgetting factor A according to the relationship map. As shown in FIG. 4, the higher SOC provides the greater forgetting factor A at an identical temperature of the secondary battery 130. The higher temperature also provides the greater forgetting factor A at an identical SOC of the secondary battery 130. The forgetting factor A is set in such a range that meets the condition of Expression 3 given below:

$$0<A \times \Delta t<1 \qquad \text{Expression 3}$$

As understood from Expression 2 and Expression 3, the value "A×Δt" closer to 1 provides the greater decrease D(−) in evaluation value. In other words, the greater forgetting factor A or the longer cycle time Δt provides the greater decrease D(−) in evaluation value. The method employed to calculate the decrease D(−) is not limited to the method expressed by Expression 2 but may be any method that specifies the degree of reduction in localization of the ion concentration with elapse of time.

The increase D(+) in evaluation value is a value estimating the degree of increase in localization of the ion concentration accompanied with charge or discharge until elapse of one cycle time Δt since calculation of the previous evaluation value D(N−1). For example, the battery controller 30 calculates the increase D(+) in evaluation value according to Expression 4 given below:

$$D(+) = I \times \Delta t \times (B/C) \qquad \text{Expression 4}$$

In Expression 4, "I" represents a current value, "B" represents a current coefficient, "C" represents a limit value. The current value I is a value that is obtained based on the output signal of the current detector 50 and that includes the direction of electric current. The current value I takes a positive value when the secondary battery 130 is discharged, while taking a negative value when the secondary battery 130 is charged. The current coefficient B is a coefficient stored in advance in the ROM 31. The battery controller 30 reads out to use the current coefficient B from the ROM 31.

The limit value C is a value determined based on the SOC of the secondary battery 130 and the temperature of the secondary battery 130. The battery controller 30 obtains, for example, a relationship map of the limit value C to the temperature and the SOC as shown in FIG. 5 by a discharge experiment of the secondary battery 130 and the like and stores the obtained relationship map in the ROM 31. The battery controller 30 determines the limit value C according to the relationship map.

As understood from Expression 4, the increase D(+) take a positive value when the secondary battery 130 is discharged, while taking a negative value when the secondary battery 130 is charged. This is because the localization of the ion concentration proceeds in opposite directions during charging and during discharging of the secondary battery 130. The larger absolute value of the current value I or the longer cycle time Δt provides the larger absolute value of the increase D(+) in evaluation value. The method employed to calculate the increase D(+) is not limited to the method expressed by Expression 4 but may be any method that specifies the degree of increase in localization of the ion concentration accompanied with charge or discharge.

The battery controller 30 calculates the current evaluation value D(N) by using the previous evaluation value D(N−1), the decrease D(−) in evaluation value calculated according to Expression 2 and the increase D(+) in evaluation value calculated according to Expression 4, as shown by Expression 1. The battery controller 30 then stores the calculated evaluation value D(N) in the RAM 33. Storage of the evaluation value D(N) in the RAM 33 enables the battery controller 30 to monitor a change in evaluation value D(N).

The battery controller 30 also calculates the integrated value E based on the valuation value D(N). More specifically, the integrated value E at the current time may be obtained, for example, by integrating De(N) that is part of the evaluation value D(N) out of a predetermined range Dt(+) to Dt(−) of a target value as shown in FIG. 6 according to Expression 5 given below. Dt(+) and Dt(−) are numerical values that have an identical absolute value but have different signs:

$$De(N) = D(N) \cdot Dt(+) \text{ when } D(N) > Dt(+) > 0,$$

$$De(N) = D(N) \cdot Dt(-) \text{ when } D(N) < Dt(-) < 0, \text{ and}$$

$$De(N) = 0 \text{ when } Dt(-) \leq D(N) \leq Dt(+) \qquad \text{Expression 5}$$

where a denotes a correction factor by taking into account reduction of the high rate degradation and meets a relationship of 0<a<1.

For example, the battery controller 30 may calculate the integrated value E every time the evaluation value D(N) is calculated and store the calculated integrated value E in the RAM 33. In another example, the battery controller 30 may integrate the evaluation values D(N) obtained to a previous integrated value E at a predetermined timing and store a new integrated value E in the RAM 33. The integrated value E is thus, for example, a numerical value indicating the degree of the high rate degradation integrated from the initial state. The integrated value E is one example of the decision value. The method employed to calculate the integrated value E is not limited to the method of integrating the evaluation value D(N) as expressed by Expression 5 but may be any method that specifies the degree of the high rate degradation at the current time.

What is claimed is:

1. A fuel cell system configured to supply a required power that is required from a load, the fuel cell system comprising:
   a power supply circuit that includes a fuel cell and a secondary battery and is configured to supply electric power from the fuel cell and the secondary battery to the load and to charge the secondary battery with electric power from the fuel cell;
   a decision value acquirer configured to monitor a charge-discharge state of the secondary battery for obtaining a decision value that is used to determine a degree of localization of an ion concentration in an electrolytic solution in the secondary battery; and
   a controller programmed to control the power supply circuit according to the decision value, wherein
      when the decision value becomes equal to or greater than a predetermined reference value, the controller is programmed to impose a limitation on discharge of the secondary battery to prevent over-discharge of the secondary battery, and
      when the decision value is equal to or greater than the reference value and the required power decreases, the controller is programmed to impose a limitation on a decrease in output power of the fuel cell wherein the fuel cell charges the secondary battery with at least part of electric power corresponding to the limitation imposed on the decrease in the output power.

2. The fuel cell system according to claim 1,
   the fuel cell system being mounted on a vehicle, and
   the fuel cell system further comprising a route setter configured to set a scheduled drive route, based on location information of the vehicle and map information, wherein
   when the decision value is predicted to become equal to or greater than the reference value in the scheduled drive route and the required power decreases, the controller is programmed to impose the limitation on the decrease in the output power to charge the secondary battery with at least part of electric power corresponding to the limitation imposed on the decrease in the output power.

$$E = a \times \Sigma De(N-1) + De(N)$$

3. The fuel cell system according to claim 2, further comprising:
a cooling medium circulation system including a radiator configured to cool down a cooling medium of the fuel cell, wherein
when the decision value is predicted to become equal to or greater than the reference value in the scheduled drive route, the controller is programmed to control the cooling medium circulation system to decrease temperature of the fuel cell.

4. The fuel cell system according to claim 2,
wherein the controller is programmed to obtain information regarding an uphill road included in the scheduled drive route and predicts that the decision value becomes equal to or greater than the reference value.

5. The fuel cell system according to claim 2,
wherein the route setter includes a storage unit configured to store a driving record that records a section where the decision value became equal to or greater than the reference value during a past run of the vehicle, wherein
the controller is programmed to predict that the decision value becomes equal to or greater than the reference value in the scheduled drive route, based on the location information, the map information and the driving record.

6. The fuel cell system of according to claim 1, wherein the imposed limitation on the decrease in the output power of the fuel cell causes the output power to be maintained at a level immediately before a start in a decrease of the required power.

7. The fuel cell system of according to claim 6, wherein the required power decreases in response to a reduction in an accelerator position of a vehicle and the output power of the fuel cell is maintained at the level immediately before a start in the reduction in the accelerator position of the vehicle.

* * * * *